United States Patent
Graef

(10) Patent No.: US 7,669,110 B2
(45) Date of Patent: Feb. 23, 2010

(54) TRACE-AHEAD METHOD AND APPARATUS FOR DETERMINING SURVIVOR PATHS IN A VITERBI DETECTOR

(75) Inventor: Nils Graef, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 530 days.

(21) Appl. No.: 11/241,760

(22) Filed: Sep. 30, 2005

(65) Prior Publication Data

US 2007/0079225 A1  Apr. 5, 2007

(51) Int. Cl.
*H03M 13/03* (2006.01)
(52) U.S. Cl. .................. 714/795; 714/794; 714/792; 375/341
(58) Field of Classification Search ............. 714/795
See application file for complete search history.

(56) References Cited

U.S. PATENT DOCUMENTS

| | | | | |
|---|---|---|---|---|
| 3,789,360 | A * | 1/1974 | Clark et al. | 714/792 |
| 6,088,405 | A * | 7/2000 | Hladik et al. | 375/341 |
| 6,141,384 | A * | 10/2000 | Wittig et al. | 375/240.25 |
| 6,366,418 | B1 * | 4/2002 | McEwen et al. | 360/48 |
| 6,694,477 | B1 * | 2/2004 | Lee | 714/784 |
| 6,937,617 | B2 * | 8/2005 | Rakib et al. | 370/485 |
| 2006/0026494 | A1 * | 2/2006 | Varma et al. | 714/795 |

OTHER PUBLICATIONS

U.S. Appl. No. 11/241,759, filed Sep. 30, 2005, Graef.
U.S. Appl. No. 11/241,761, filed Sep. 30, 2005, Graef.

* cited by examiner

*Primary Examiner*—M. Mujtaba K Chaudry
*Assistant Examiner*—Enam Ahmed
(74) *Attorney, Agent, or Firm*—Ryan, Mason & Lewis, LLP

(57) ABSTRACT

Methods and apparatus are provided for determining survivor paths in a Viterbi detector, using a trace-ahead algorithm. A trellis memory is maintained having a depth L that stores L trellis stages, each of the L stages having a plurality, N, of trellis states; and a status memory is maintained for each of the N states of the trellis, wherein each entry in the status memory identifies a least recent trellis state stored in the trellis memory of a survivor path that begins at a given state on a side of the trellis associated with most recent states. A bit sequence of one or more of the survivor paths in the trellis is determined in an order that the bits are received by examining least and most recent trellis stages of the trellis and the status memory. One or fork memories maintain an indicator of whether a given fork is active; a list of active forks; a trellis position of active forks in the trellis; and a fork type of one or more forks in the trellis.

22 Claims, 13 Drawing Sheets

BIT = 0 (CASE 0):    |    BIT = 1 (CASE 1):

state0 — state2     |    state0 ✕ state2
state1 — state3     |    state1 ✕ state3

—✕— DISCARDED BRANCH
←✕— DISCARDED PATH
← ACTIVE PATH

FIG. 11A

| DATA OBJECT | DESCRIPTION |
|---|---|
| TRELLIS[0:1][1:L] | THE TRELLIS MEMORY OF DEPTH L AND WIDTH 2. THE BIT TRELLIS[0][y] IS ASSOCIATED WITH THE UPPER BUTTERFLY AT STAGE y. THE BIT TRELLIS [1][y] IS ASSOCIATED WITH THE LOWER BUTTERFLY AT STAGE y. THE ENCODING OF THE BITS ARE DEFINED BY THE FOLLOWING FIG. (SEE ALSO FIG. 19):<br><br>BIT = _ (i.e., BIT = 0):   BIT = X (i.e., BIT = 1):<br>state0 ●———● state2    state0 ●╲╱● state2<br>state1 ●———● state3    state1 ●╱╲● state3<br><br>NOTE: _ AND X ARE VERILOG PARAMETERS THAT ARE SET TO 0 AND 1, RESPECTIVELY, SEE TABLE BELOW.<br>NOTE THE FOLLOWING CONVENTION: WE WILL ALWAYS WRITE "_" TO THE TRELLIS MEMORY IN CASE THE CORRESPONDING BUTTERFLY CONTAINS A FORK.<br>THIS MAY BE OVERWRITTEN LATER BY THE FORK-BRANCH RECONNECTION PROCEDURE. |
| LEFT[A:D][1:0] | LEFT[X] IDENTIFIES THE LEFT END STATE OF THE SURVIVOR PATH THAT BEGINS AT STATE X AT THE RIGHT END. POSSIBLE VALUES ARE A, B, C, D.<br>SO e.g., LEFT[B] = C MEANS THAT THE SURVIVOR PATH THAT BEGINS AT THE RIGHTMOST STATE B ENDS IN THE LEFTMOST STATE C, SO C←B. |
| FORK_ACTIVE[0:2] | FORK_ACTIVE[x] = 1 INDICATES THAT FORK x IS ACTIVE, WHERE x IS 0, 1, OR 2 TO REFER TO ONE OF THE UP TO THREE ACTIVE FORKS.<br>FORK_ACTIVE[x] = 0 INDICATES THAT FORK x IS INACTIVE AND THAT THE OTHER FORK_*[x] DATA OBJECTS ARE INVALID. |

FIG. 11B

| | |
|---|---|
| FORK_ROW[0:2]<br>FORK_COL[0:2][L2:0] | THESE 2 DATA OBJECTS SPECIFY THE TRELLIS POSITIONS OF THE ACTIVE FORKS RELATIVE TO THE TRELLIS MEMORY'S ROWS AND COLUMNS. FORK_COL[x] = y AND FORK_ROW[x] = 0 OR 1 SPECIFY THAT FORK x IS LOCATED AT THE UPPER OR LOWER, RESP., BUTTERFLY OF COLUMN y OF THE TRELLIS MEMORY. |
| FORK_TYP[0:2] | FORK_TYP[x] SPECIFIES THE TYPE OF FORK x. POSSIBLE VALUES ARE 0 AND 1, WHICH ARE ENCODED AS SHOWN IN THE FOLLOWING FIG:<br><br>BIT = 0       BIT = 1<br>state0 ●——● state2    state0 ●    ● state2<br>state1 ●    ● state3    state1 ●——● state3 |
| FORK_TOP[0:2][2:0] | • IF THE TOP-BRANCH OF FORK x IS CONNECTED TO ANOTHER ACTIVE FORK y THAT IS LOCATED RIGHT FROM FORK x, THEN FORK_TOP[x] EQUALS y, WHERE y = F0, F1, F2 IDENTIFIES FORK 0, 1, 2, RESP.<br>• ELSE, FORK_TOP[x] = u INDICATES THAT THERE IS A CONNECTION FROM THE RIGHT-MOST STATE u TO THE TOP-BRANCH OF FORK x, WHERE u = A, B, C, OR D. |
| FORK_BOT[0:2][1:0] | • IF THE BOTTOM-BRANCH OF FORK x IS CONNECTED TO ANOTHER ACTIVE FORK y THAT IS LOCATED RIGHT FROM FORK x, THEN FORK_BOT[x] EQUALS y, WHERE y = F0, F1, F2 IDENTIFIES FORK 0, 1, 2, RESP.<br>• ELSE, FORK_BOT[x] = u INDICATES THAT THERE IS A CONNECTION FROM THE RIGHT-MOST STATE u TO THE BOTTOM-BRANCH OF FORK x, WHERE u = A, B, C, OR D. |

1200

| PARAMETER | DESCRIPTION |
|---|---|
| F0 = 5 | IDENTIFIES FORK 0 |
| F1 = 6 | IDENTIFIES FORK 1 |
| F2 = 7 | IDENTIFIES FORK 2 |
| _ = 0 | USED FOR ENTRIES OF THE TRELLIS MEMORY. _ INDICATES THAT THE BRANCHES OF THE BUTTERFLY SUBTRELLIS ARE PARALLEL. |
| X = 1 | USED FOR ENTRIES OF THE TRELLIS MEMORY. X INDICATES THAT THE BRANCHES OF THE BUTTERFLY SUBTRELLIS ARE CROSSED. |
| L2 | = CEIL (log2(L)). L SPECIFIES THE MEMORY DEPTH. |

| ALGORITHM | LATENCY | THROUGHPUT | MEMORY COMPLEXITY | | MEMORY SWITCHING ACTIVITY |
|---|---|---|---|---|---|
| | | | # LATCHES | # MUX2 | |
| RE | LOW | HIGH | 2 x N x L | N x L | HIGH PROPORTIONAL TO N AND L |
| TB | HIGH | LOW | N x L | 0 | LOW PROPORTIONAL TO N AND INDEPENDENT FROM L |
| TRACE AHEAD ALGORITHM | SAME AS RE | SAME AS RE | 0.5 x N x L | 0 | ABOUT 50% LOWER THAN TB, BECAUSE MEMORY IS 50% SMALLER. PROPORTIONAL TO N AND INDEPENDENT FROM L. |

2000

TRACE-AHEAD METHOD AND APPARATUS FOR DETERMINING SURVIVOR PATHS IN A VITERBI DETECTOR

FIELD OF THE INVENTION

The present invention relates generally to Viterbi detection techniques and, more particularly, to the techniques for storing survivor paths in a Viterbi detector.

BACKGROUND OF THE INVENTION

A magnetic recording read channel converts an analog read signal into an estimate of the user data recorded on a magnetic medium. Read heads and magnetic media introduce noise and other distortions into the read signal. As the information densities in magnetic recording increase, the intersymbol interference (ISI) becomes more severe as well, (i.e., the channel impulse response becomes longer). In a read channel chip, a Viterbi detector is often employed to detect the read data bits in the presence of intersymbol interference and noise.

Generally, Viterbi detectors employ maximum-likelihood decoding of convolutional codes to determine the optimum path through a code trellis. Viterbi detectors use the trellis structure and determine the maximum-likelihood estimate of the transmitted sequence. A survivor path is identified that is the most likely path having the largest accumulated metric through the trellis. The metric of all paths entering each state are compared and the survivor with the largest accumulated metric is maintained at each state.

A conventional Viterbi decoder 100, shown in FIG. 1, typically comprises a branch metric unit (BMU) 110, an add/compare/select unit (ACSU) 120, a survivor path memory unit (SPM) 130 and a decision feedback unit (DFU) 140. For a detailed discussion of conventional Viterbi decoders, see, for example, Borivoje Nikolic et al., "Read/Write Channel Implementation," in Coding and Signal Processing for Magnetic Recording Systems, CRC Press, (2005, Bane Vasic and Erozan M. Kuratas editors), incorporated by reference herein.

Generally, as shown in FIG. 1, the decision-feedback unit 140 computes separate ISI estimates for each trellis state, the branch metric unit 110 computes branch metrics for all transitions, the add-compare-select unit 120 determines the best survivor path into each state, and the survivor path memory 130 stores the survivor paths.

Typically, a survivor path memory unit implements a register-exchange or trace-back architecture to generate the survivor symbols for each state. In a register-exchange survivor memory implementation, survivor symbols for each state are stored and updated at each detection step. In a trace-back implementation, ACS decisions are stored as pointers in a memory, and the detected symbols are obtained by tracing back the pointers that correspond to a survivor path.

The trace-back architecture does not require the updating of all survivor symbols at each detection step. Thus, the trace-back architecture is associated with less power consumption than the register-exchange architecture. The trace-back architecture, however, is associated with larger detection latency and therefore is generally not suitable for most Viterbi detection applications. The register exchange algorithm exhibits higher dynamic power consumption than the trace-back algorithm, because the register exchange algorithm requires one flip flop for each memory bit, and the whole memory contents is updated in each clock cycle of the register exchange algorithm, resulting in higher switching activity. The trace-back, on the other hand, only updates N memory bits in each clock cycle for an N-state radix-2 trellis.

A need therefore exists for an improved survivor path memory that features lower switching activity and power consumption.

SUMMARY OF THE INVENTION

Generally, methods and apparatus are provided for determining survivor paths in a Viterbi detector, using a trace-ahead algorithm. According to one aspect of the invention, a trellis memory is maintained having a depth L that stores L trellis stages, each of the L stages having a plurality, N, of trellis states; and a status memory is maintained for each of the N states of the trellis, wherein each entry in the status memory identifies a least recent trellis state stored in the trellis memory of a survivor path that begins at a given state on a side of the trellis associated with most recent states. A bit sequence of one or more of the survivor paths in the trellis is determined in an order that the bits are received by examining least and most recent trellis stages of the trellis and the status memory. Least recent stages are deleted from the trellis by (i) reading out least recent bits of survivor paths; (ii) updating the status memories; and (iii) appending a new stage at the most recent end of the trellis.

A new stage is appended at the most recent end of the trellis by updating the status memory and one or more fork registers containing information on one or more forks in the trellis and reconnecting discarded fork branches. One or fork memories maintain an indicator of whether a given fork is active; a list of active forks; a trellis position of active forks in the trellis; and a fork type of one or more forks in the trellis.

A more complete understanding of the present invention, as well as further features and advantages of the present invention, will be obtained by reference to the following detailed description and drawings.

BRIEF DESCRIPTION OF THE DRAWINGS

FIGS. 11A and 11B, collectively, are a table describing properties of various data objects employed by the present invention;

FIG. 20 is a table illustrating a number of benefits of the trace ahead algorithm of the present invention.

DETAILED DESCRIPTION

The present invention reduces the dynamic power consumption of a survivor path memory. According to one aspect of the invention, survivor paths are determined using a trace-ahead algorithm. The disclosed trace-ahead algorithm traverses the trellis in the opposite direction of the well known trace back algorithm, namely, the trellis is traversed from left to right to determine the bit sequence of the survivor path. Thus, the bits of the survivor paths are determined in the same order as they are received (from left to right in a trellis). In this manner, the disclosed trace-ahead algorithm exhibits improved latency and throughput, relative to the trace-back algorithm. Among other benefits, the disclosed trace-ahead algorithm exhibits a dynamic power consumption that is independent of the memory depth and is lower than that of a register exchange implementation.

Register Exchange

Figure 1:
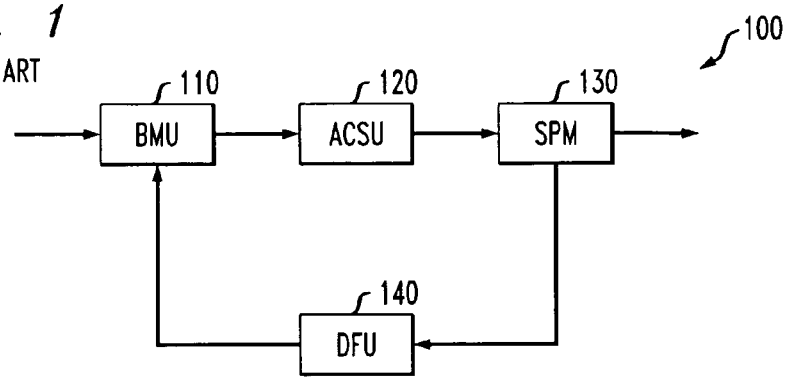
FIG. 1 is a schematic block diagram of a conventional Viterbi decoder.
Figure 2:
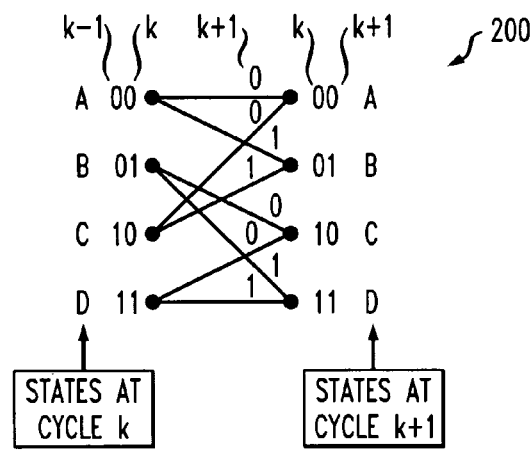
FIG. 2 illustrates an exemplary radix-2 trellis for a 4-state Viterbi detector.

As previously indicated, a register-exchange survivor memory implementation stores and updates survivor symbols for each state at each detection step. FIG. 2 illustrates an exemplary radix-2 trellis 200 for a 4-state Viterbi detector. As shown in FIG. 2, the trellis 200 defines the transitions between the states at cycle k and the states at cycle k+1.

The input signal to the SPM 130, acsu[3:0], is the output signal from the ACSU 120. The acsu signal encodes the selections made by the ACSU 120, as follows:

acsu[A] specifies the survivor branch selection made by the ACSU for State A:
  If acsu[A]==TOP (indicating that the top branch is the survivor branch), then the ACSU has selected the "top" branch that enters State A at cycle k+1, i.e., the branch A(k)→A(k+1), see FIG. 2.
  If acsu[A]==BOT (indicating that the bottom branch is the survivor branch), then the ACSU has selected the "bottom" branch that enters State A at cycle k+1, i.e., the branch C(k)→A(k+1), see FIG. 2.

acsu[B] specifies the survivor branch selection made by the ACSU for State B:
  If acsu[B]==TOP, then the ACSU has selected the "top" branch that enters State B at cycle k+1, i.e., the branch A(k)→B(k+1), see FIG. 2.
  If acsu[B]==BOT, then the ACSU has selected the "bottom" branch that enters State B at cycle k+1, i.e., the branch C(k)→B(k+1), see FIG. 2.

acsu[C] specifies the survivor branch selection made by the ACSU for State C:
  If acsu[C]==TOP, then the ACSU has selected the "top" branch that enters State C at cycle k+1, i.e., the branch B(k)→C(k+1), see FIG. 2.
  If acsu[C]=BOT, then the ACSU has selected the "bottom" branch that enters State C at cycle k+1, i.e., the branch D(k)→C(k+1), see FIG. 2.

acsu[D] specifies the survivor branch selection made by the ACSU for State D:
  If acsu[D]==TOP, then the ACSU has selected the "top" branch that enters State D at cycle k+1, i.e., the branch B(k)→D(k+1), see FIG. 2.
  If acsu[D]=BOT, then the ACSU has selected the "bottom" branch that enters State D at cycle k+1, i.e., the branch D(k)→D(k+1), see FIG. 2.

According to the conventional register exchange algorithm, the survivor path memory (SPM) 130 is implemented as four registers, labeled Register A through Register D. Register i (where i∈{A, B, C, D}) contains the bit-sequence of the survivor path of State i. At every clock cycle, the four registers are updated as follows:

Register A is updated based on the input signal acsu[A]:
  If acsu[A]==TOP, then the bit-sequence contained in register A is shifted left by one bit and "0" is appended to the right-hand end of the register.
  If acsu[A]==BOT, then the bit-sequence contained in register C is copied to register A and shifted left by one bit and "0" is appended to the right-hand end of the register.

Register B is updated based on the input signal acsu[B]:
  If acsu[B]==TOP, then the bit-sequence contained in register A is copied to register B and shifted left by one bit and "1" is appended to the right-hand end of the register.
  If acsu[B]==BOT, then the bit-sequence contained in register C is copied to register B and shifted left by one bit and "1" is appended to the right-hand end of the register.

Register C is updated based on the input signal acsu[C]:
  If acsu[C]==TOP, then the bit-sequence contained in register B is copied to register C and shifted left by one bit and "0" is appended to the right-hand end of the register.
  If acsu[C]==BOT, then the bit-sequence contained in register D is copied to register C and shifted left by one bit and "0" is appended to the right-hand end of the register.

Register D is updated based on the input signal acsu[D]:
  If acsu[D]==TOP, then the bit-sequence contained in register B is copied to register D and shifted left by one bit and "1" is appended to the right-hand end of the register.
  If acsu[D]==BOT, then the bit-sequence contained in register D is shifted left by one bit and "1" is appended to the right-hand end of the register.

Figure 3:
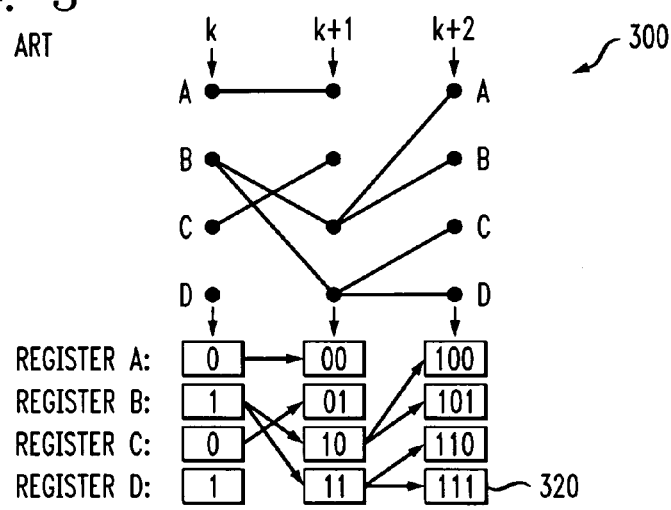
FIG. 3 is an exemplary trellis for illustrating the register exchange algorithm.

FIG. 3 is an exemplary trellis 300 for illustrating the register exchange algorithm. There are several possible schemes for generating the output of the SPM 130, as follows:

Assume that the survivor paths of all states always converge after L clock cycles (where L is the depth of the survivor path memory). Thus, the four registers will always have identical values at their left-most positions. So the SPM output equals the left-most bit of any register, e.g., Register A.

If this assumption is not accurate, then there are two ways to generate the output of the SPM 130:

The output of the SPM 130 equals the leftmost bit of the register whose associated survivor path has the largest path metric.

The output of the SPM 130 equals the average across the four leftmost bits of the four registers, A through D, rounded to the nearest integer 0 or 1.

A. Hardware Implementation

For a detailed discussion of conventional hardware implementations of the register exchange algorithm, see, for example, Borivoje Nikolic et al., "Read/Write Channel Implementation," in Coding and Signal Processing for Magnetic Recording Systems, CRC Press, (2005, Bane Vasic and Erozan M. Kuratas editors).

Figure 4:
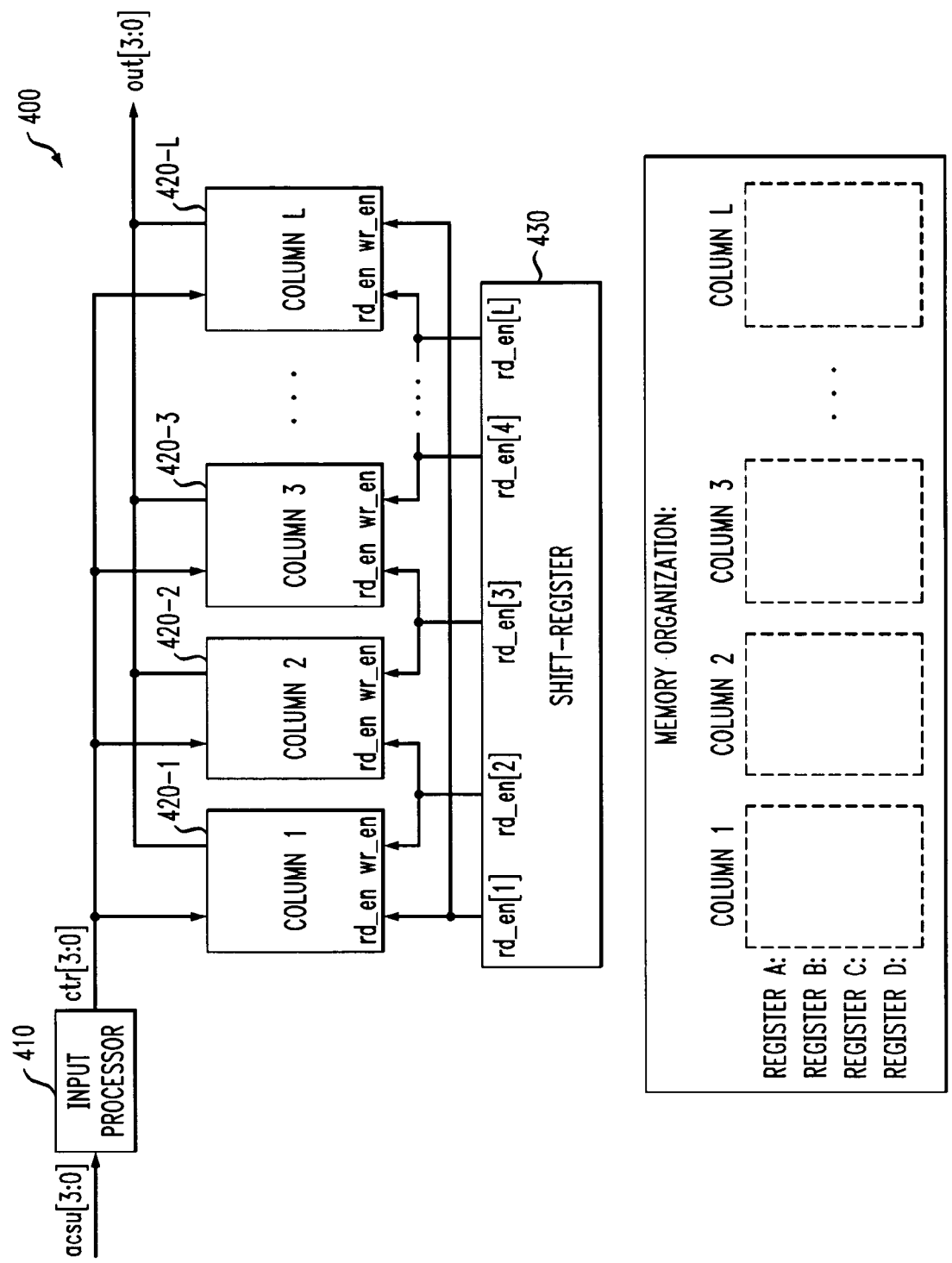
FIG. 4 is a block diagram of an exemplary hardware implementation of the register exchange algorithm for a 4-state radix-2 SPM.
Figure 5:
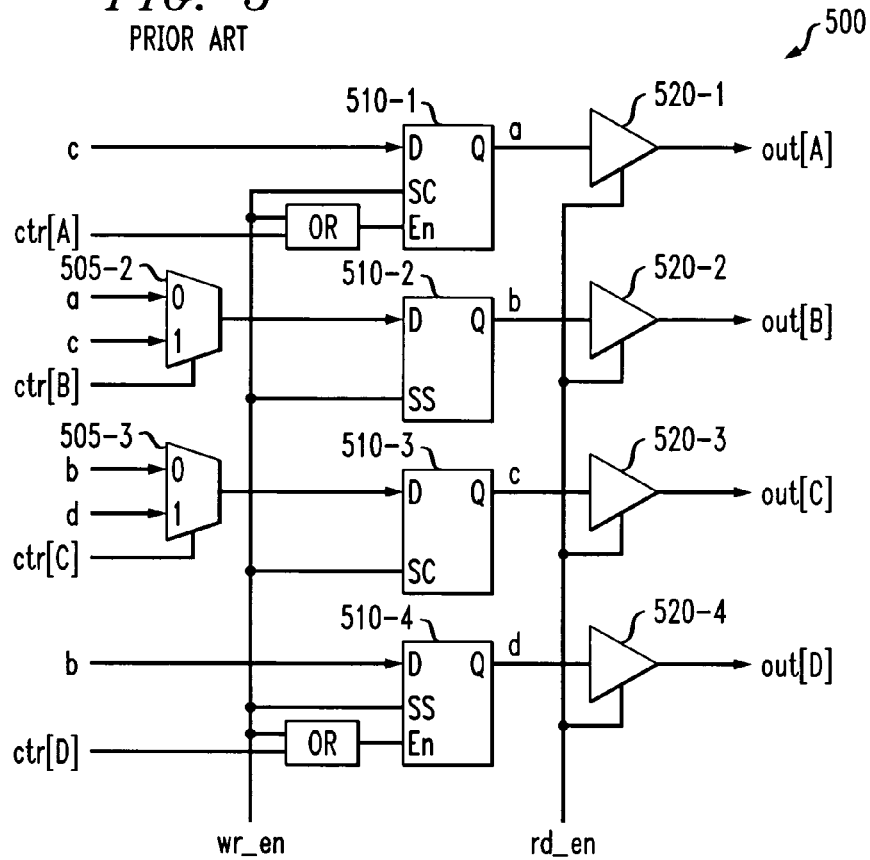
FIG. 5 thus illustrates one column of the SPM of FIG. 4.

FIG. 4 is a block diagram of an exemplary hardware implementation of the register exchange algorithm for a 4-state radix-2 SPM 400. As shown in FIG. 4, the exemplary SPM 400 comprises an input processor 410, a plurality of memory columns 420-1 through 420-L and a shift-register 430. The shift-left operation is implemented without actually shifting data from one flip-flop to another but by rotating the read and write "pointers" (i.e., rd_en and wr_en), which is done by the shift-register 430. The SPM 400 is organized in columns, each implemented as shown in FIG. 5. FIG. 5 thus illustrates one column of the SPM 400 of FIG. 4. It is noted that although the connections are not shown in FIG. 5, the inputs a, b, c, d shown on the left of FIG. 5 are actually connected to the outputs of the flip-flops 510-1 through 510-4, which are also labeled a, b, c, d, respectively. It is noted that the flip flips 510 may alternatively be implemented as another memory element type, such as a latch, transistor logic, processor logic, or other types of gates.

It is noted that the four flip-flops 510-1 through 510-4 represent, e.g., the four states A, B, C, D of one trellis stage of the trellis shown in FIG. 3. As shown in FIG. 5, if wr_en equals 1, then the four flip-flops 510 (a, b, c, d) are set to a=0, b=1, c=0, d=1. Otherwise, (i.e., if wr_en equals 0), then the flip-flops 510 are controlled by signal ctr[3:0] provided by the input processor 410.

The input processor 410 generates the ctr[3:0] signal for the memory columns 420 as follows:

ctr[A]=(acsu[A]==BOT)
ctr[B]=(acsu[B]==BOT)
ctr[C]=(acsu[C]==BOT)
ctr[D]=(acsu[D]==TOP)

It is noted that the clock inputs of flip-flops a and d can be gated by their respective enable signal to reduce the switching activity at the clock inputs of the flip-flops.

The differences between the implementation of FIGS. 4 and 5 and the one shown by Borivoje Nikolic et al., referenced above, are as follows:

Lower switching activity for registers A and D, because these registers are not enabled in the case that ctr[A]==0 or ctr[D]==1, respectively.

Each N-state column 420 requires N additional tri-state buffers 520, but it also saves two multiplexers 505 compared with the implementations of Borivoje Nikolic et al. It is also noted that, if it can be assumed that the survivor paths of all states always converge after L clocks, then only one tri-state buffer 520 (instead of N) is required for each N-state column.

An additional control shift-register 430 is required.

It is noted that the inputs to the flip flops 510 comprise synchronized set (SS), synchronized clear (SC) and enable (EN).

B. Dynamic Power Consumption

The dynamic power consumption of the four flip-flops a, b, c, d in FIG. 5 is proportional to their individual switching activities $\alpha_a$, $\alpha_b$, $\alpha_c$, $\alpha_d$, which are derived in the following:

Flip-flop a only switches if its enable signal is 1 (i.e., acsu[A]==BOT) and if c≠a. With the assumptions that p(c≠a)=0.5 and p(acsu[A]==BOT)=0.5, the switching activity for flip-flop a yields $\alpha_a$ 32 0.25, where p(event) is the probability that the event occurs.

Similar considerations for flip-flop d yields $\alpha_d$=0.25.

Flip-flop b is always enabled. It is switched in the following two cases:
 if acsu[B]==BOT and c≠b
 or if acsu[B]==TOP and a≠b So with the following assumptions:

$p(acsu[B]==BOT)=p(acsu[B]==TOP)=0.5$ and
$p(c≠b)=p(a≠b)=0.5$ $\alpha_b$=0.5·0.5+0.5·0.5=0.5.

Similar considerations for flip-flop c yield $\alpha_c$=0.5.

With the above assumptions, the total switching activity for a 4-state SPM of depth L equals 1.5·L.

Trace Ahead Algorithm for Survivor Path Memory Management

Embodiments of the present invention provide novel algorithms that, unlike the well-known trace-back algorithm, traverses the trellis from left to right to determine the bit sequence of the survivor path in the same order that it has been received.

A. 4-State Radix-2

The known disadvantages of the conventional trace-back algorithm, such as high latency and low throughput, arise from the fact that the trellis is traversed from right to left, i.e., from the newest to the oldest trellis stage, in order to find the survivor path associated with each of the four states on the right. This works because there is always only one path from each state on the right to exactly only one state on the left.

Figure 6:
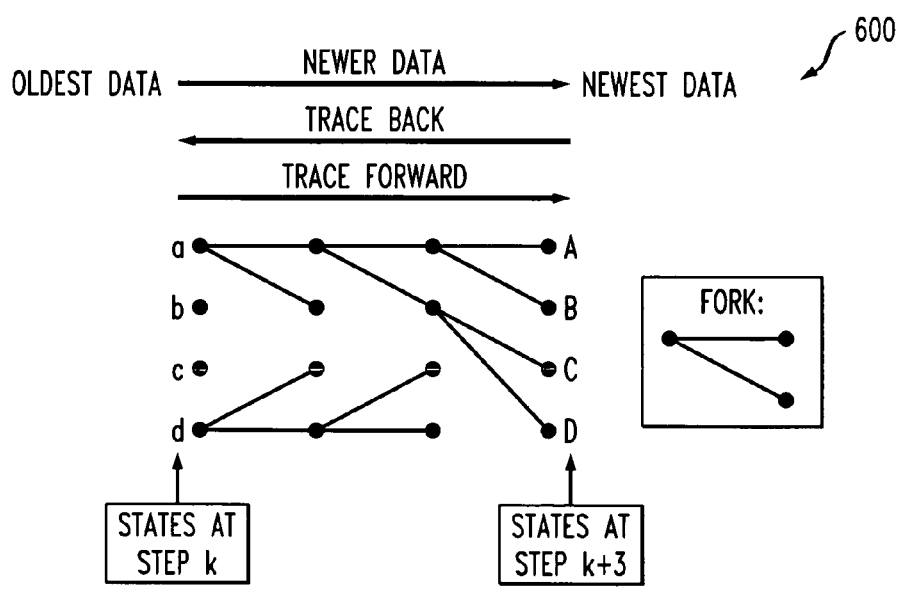
FIG. 6 illustrates the processing forks in a trellis in accordance with trace-ahead and trace-back algorithm.

FIG. 6 illustrates how forks in a trellis complicate the trace-ahead implementation of the present invention. Due to the forks in the trellis 600, two or more paths starting from different states on the right could end in the same state on the left. Therefore, traversing the trellis from left to right does not always reveal only one path starting from any state on the left, and thus traversing the trellis in this direction (i.e., the trace-ahead direction) seems impractical for finding the survivor paths. Since forks in the trellis 600 present the major roadblock for a trace-ahead algorithm, forks will first be investigated.

Figure 7:
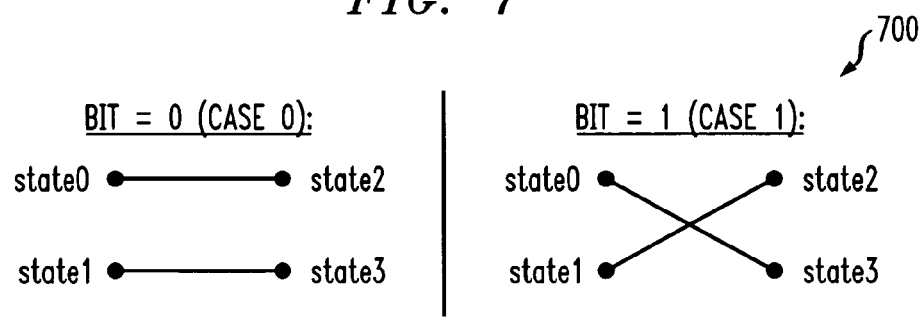
FIG. 7 illustrates the encoding of two trellis cases using a bit.

The following properties of a 4-state trellis allow the above described fork problem to be resolved:

Any trellis without any forks has exactly only one path from each left state to exactly only one right state. Storing such a forkless trellis requires only one bit per each butterfly sub-trellis. FIG. 7 illustrates the two cases 0 and 1 that are encoded by this bit. Thus, a forkless 4-state trellis of length L requires only 2L (instead of 4L) memory bits.

Any fork causes one path left from the fork to be discarded. In other words, whenever a new fork is being appended on the right end of the trellis, one previously active survivor path is being discarded.

If a discarded path contains no forks, then all branches that form the path are discarded as well.

Figure 8:
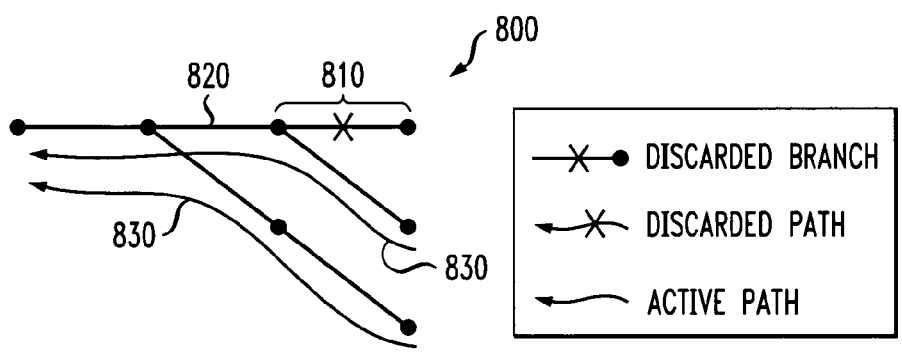
FIG. 8 illustrates the processing of forks in discarded paths.

If a discarded path contains any forks, then only the participating fork-branch (or prong) of the rightmost fork and all branches right from this fork-branch are discarded, as shown in FIG. 8, such as discarded branch 810 and discarded path 820.

The active paths 830 are maintained.

A fork, whose both branches are not discarded, is called an active fork 830. In a 4-state trellis, there can be up to three active forks, see e.g., the trellis shown in FIG. 6. It is noted that in an N-state trellis, there can be up to N−1 active forks.

Figure 9:
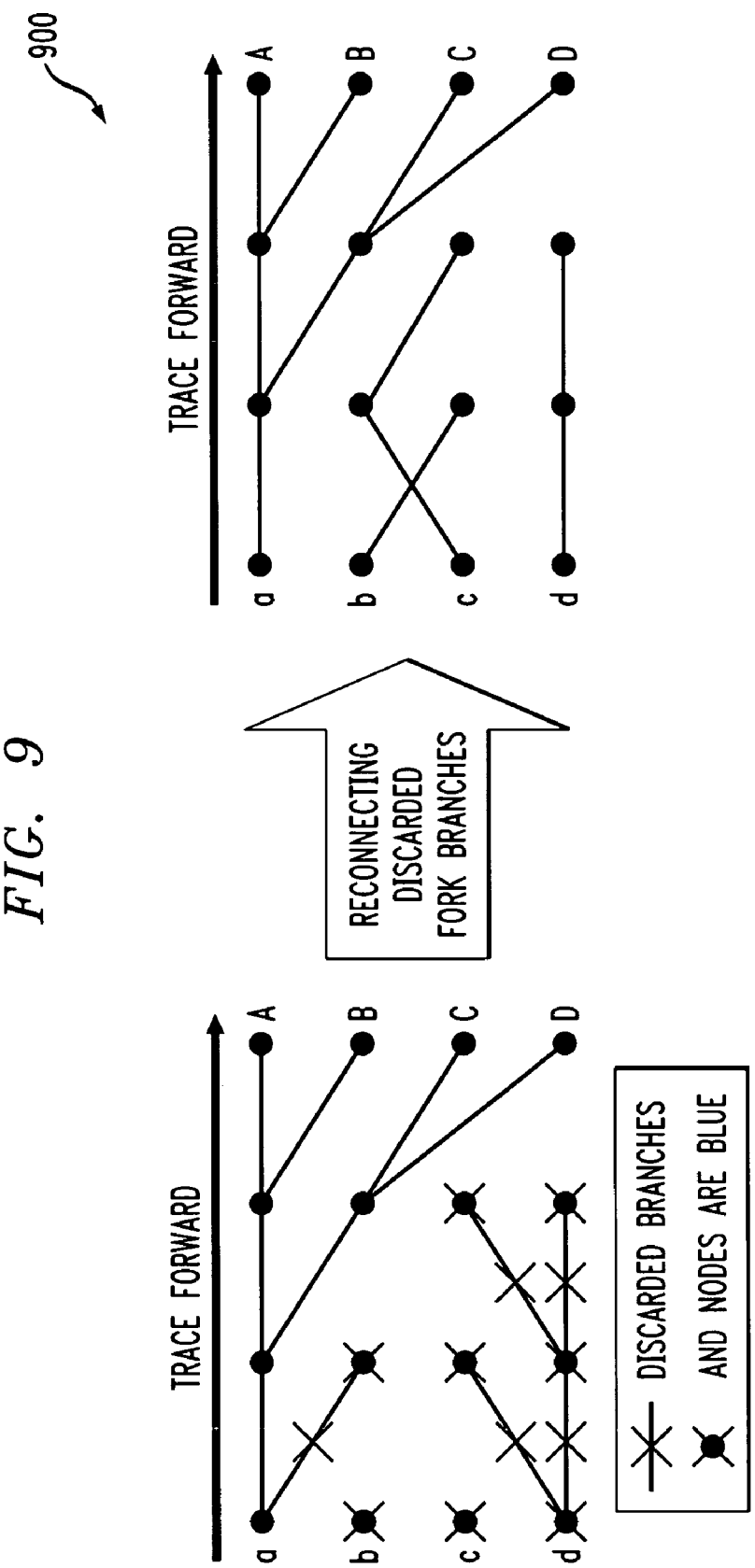
FIG. 9 illustrates a trellis reconnection procedure for reconnecting discarded branches.

Any discarded fork branch can be reconnected so that the fork is completely removed from the trellis and that traversing this new, reconnected trellis from right to left (trace back direction) still reveals the four survivor paths. Note that the reconnected trellis can only contain up to three active forks. Thus, in order to save memory bits, the three active forks can be stored separately from the rest of the trellis, which is forkless and therefore requires only 2L memory bits, as discussed above. It is noted that this concept may also be employed to reduce the memory size of a trace back implementation. FIG. 9 illustrates the trellis reconnection procedure for reconnecting discarded branches.

Figure 10:
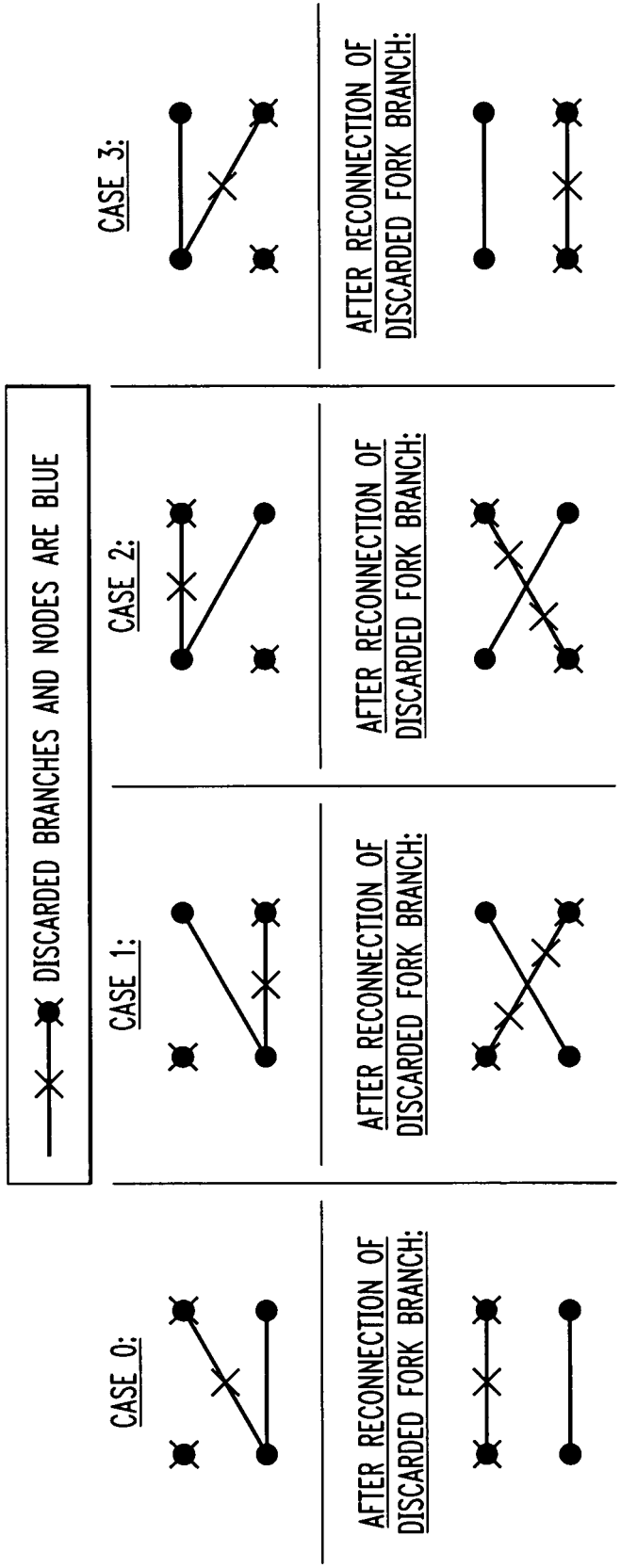
FIG. 10 illustrates four cases of fork branch reconnection.

FIG. 10 illustrates all four cases of fork branch reconnection. In case that both branches of a fork are discarded simultaneously, no reconnection is required.

Trace Ahead Algorithm and Data Objects

A. Data Objects

FIGS. 11A and 11B, collectively, show a table 1100, which describes properties of various data objects employed by one or more embodiments of the present invention. In the exemplary embodiment shown in FIGS. 11A and 11B, Verilog syntax is employed. The registers and 2-dimensional arrays shown in FIGS. 11A and 11B can be implemented by latches, RAMs or register-file macros (regfiles).

Figures 12, 13:
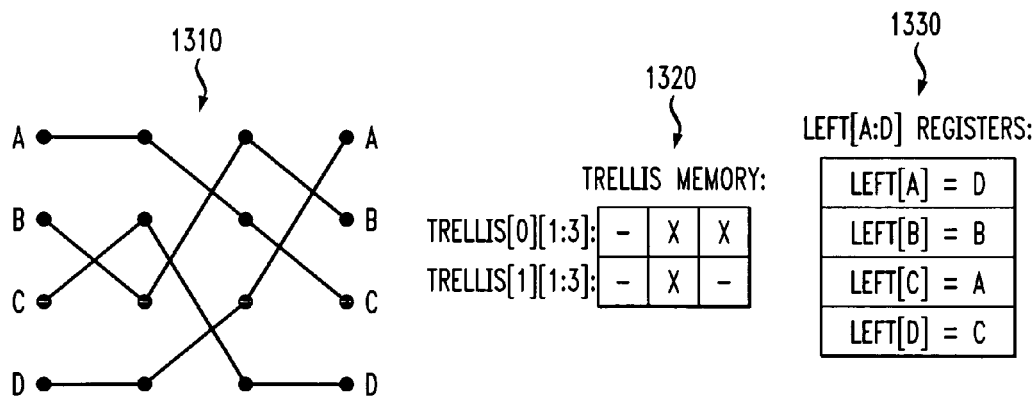
FIG. 12 is a table describing a number of parameters used by the specified data objects of FIGS. 11A and 11B.
FIG. 13 illustrates an exemplary forkless trellis and corresponding trellis memory and left[A:D] registers employed by an embodiment of the present invention.

FIG. 12 is a table 1200 describing a number of parameters used by the specified data objects of FIGS. 11A and 11B.

B. Algorithm

FIG. 13 illustrates an exemplary forkless trellis 1310 and corresponding trellis memory 1320 and left[A:D] registers 1330. For simplicity, the initialization is not shown here and it is assumed that the recorded trellis 1310 is forkless and that the left[A:D] registers 1330 are initialized correctly.

Figure 14:
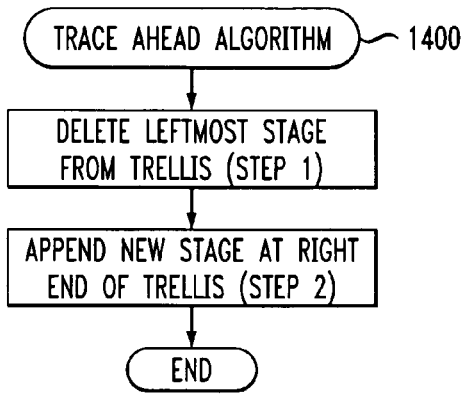
FIG. 14 is a flow chart describing an exemplary implementation of a trace ahead algorithm incorporating features of the present invention.

FIG. 14 is a flow chart describing an exemplary implementation of a trace ahead algorithm 1400 incorporating features of the present invention. The trace ahead algorithm 1400 shown in FIG. 14 is executed for each Viterbi iteration. As shown in FIG. 14, the trace ahead algorithm 1400 initially deletes the leftmost stage from the trellis during Step 1. Thereafter, the trace ahead algorithm 1400 appends a new stage at the right end of the trellis during Step 2. Each of these steps will be discussed further below in the following sections.

C. Step 1

As previously indicated, the trace ahead algorithm 1400 deletes the leftmost stage from the trellis during Step 1. This first step includes reading out the four leftmost bits of the four survivor paths (step 1a), deleting the leftmost stage from the trellis memory, and updating the left[A:D] registers accordingly (step 1b).

i. Step 1a

The four leftmost bits of the four survivor paths are read out by reading the four left-registers. For the survivor path x that is associated with the rightmost state x (x=A, B, C, or D), its leftmost bit is 0 if left[x]=A or left[x]=C, and 1 otherwise (i.e., if left[x]=B or left[x]=D).

ii. Step 1b

The left-registers are updated as follows:

If the leftmost stage doesn't contain any active forks, then the updating of the left[A:D] registers is simply done by considering the branches of the forkless leftmost stage:
If trellis[0][1]==_, then change the left register x, whose value is currently C, to B, so left[x]=C→left[x]=B.
Else (i.e., if trellis[0][1]==X), change the left registers x and y as left[x]=A→left[x]=B and left[y]=C→left[y]=A.
And if trellis[1][1]==_, then change the left register x as left[x]=B→left[x]=C.
Else (i.e., if trellis[1][1]==X), change the left registers x and y as left[x]=B→left[x]=D and left[y]=D→left[y]=C.

Else (i.e., if the leftmost stage contains at least one active fork), the fork memory has to be examined in order to update the left[A:D] registers.

Figure 15:
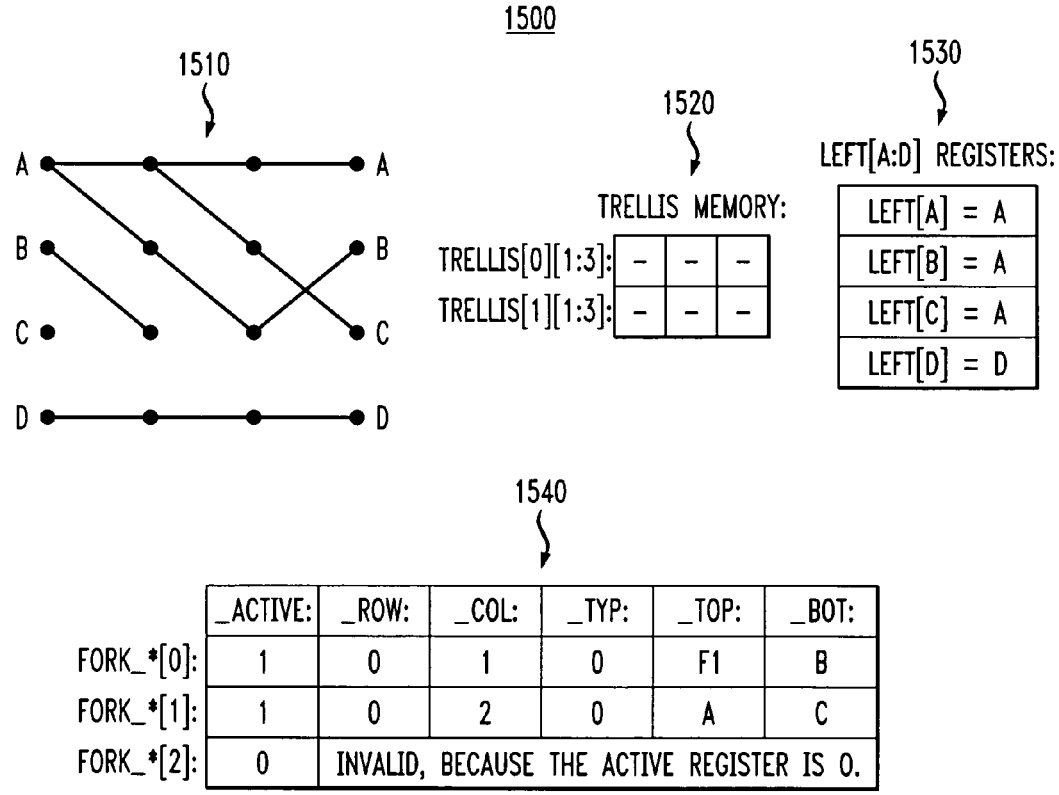
FIG. 15 illustrates an exemplary trellis and corresponding trellis memory and left[A:D] registers, where the leftmost stage contains a fork at state A.

FIG. 15 illustrates an exemplary trellis 1510 and corresponding trellis memory 1520 and left[A:D] registers 1530, where the leftmost stage contains a fork at state A. It is noted that a _ is written to the trellis memory whenever the corresponding butterfly contains a fork.

Figure 16:
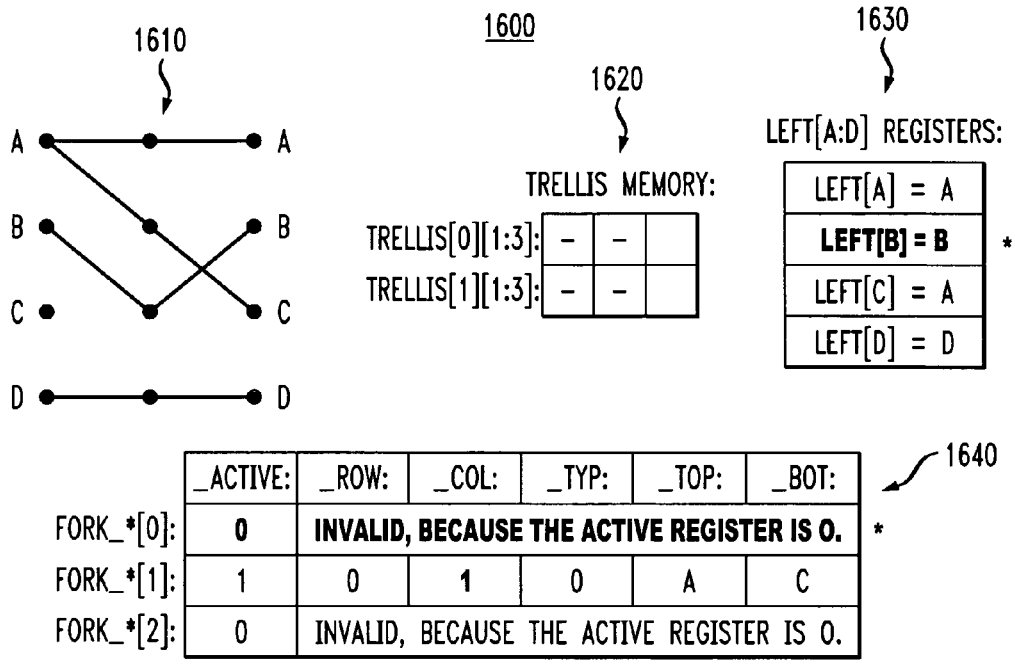
FIG. 16 illustrates the trellis and the corresponding data objects after the update (Step 1 of FIG. 14)

For the example shown in FIG. 15, the left-registers of those rightmost states that are connected to the top-branch of fork 0 must be set to A, i.e., left[A]=A and left[C]=A. Thus, there is actually no update required and the left-registers of the rightmost states that are connected to the bottom-branch of fork 0 must be updated to B. Note that fork_bot[0]=B indicates that the rightmost state B is connected to the bottom-branch of fork 0. Thus, left[B] must be updated to B. FIG. 16 illustrates the trellis 1610 and the corresponding data objects 1620, 1630, 1640 after the update (Step 1). Updated data objects are marked by an asterisk (*)

In general, the following update procedure must be executed:
If there is a fork x of type 0 at row 0 and column 1, then set the left-registers of those rightmost states, that are connected to the bottom-branch of fork x, to B as follows:
If fork_bot[x] is A, B, C, or D, then set left[A, B, C, or D] to B, respectively.
Else, if fork_bot[x] is F0, F1, or F2, then inspect fork_top[0, 1, or 2] and fork_bot[0, 1, or 2] to determine which rightmost states are connected to the bottom-branch of fork x and then set the corresponding left-registers to B.
Similarly, if there is a fork x of type 1 at row 0 and column 1, then set the left-registers of those rightmost states, that are connected to the top-branch or bottom-branch of fork x, to A or B, respectively.
Similarly, if there is a fork x of type 0 at row 1 and column 1, then set the left-registers of those rightmost states, that are connected to the top-branch or bottom-branch of fork x, to C or D, respectively.
Similarly, if there is a fork x of type 1 at row 1 and column 1, then set the left-registers of those rightmost states, that are connected to the top-branch of fork x, to C.

After updating the left-registers, any forks contained in the leftmost stage must be deleted from the fork memory by setting their respective fork_active registers to 0, the contents of the trellis memory is shifted left and the fork_col-registers of the remaining active forks are decremented accordingly. Note that the trellis memory can be implemented as a ring buffer with a head and tail pointer, so that the shift left operation is implemented by rotating the pointers instead of shifting the memory contents.

D. Step 2

As previously indicated, the trace ahead algorithm 1400 appends a new stage at the right end of the trellis during Step 2. After writing the new stage to the right end of the trellis memory, the following steps are executed:

Reconnecting discarded fork branches (Step 2a): If the new stage contains one or two forks, then one or two previously active survivor paths and their corresponding rightmost states become discarded, as explained above. For each of the discarded rightmost states, search the fork_bot and fork_top registers to see if there is any currently active fork directly connected to the discarded rightmost state. If so, then reconnect this fork by accessing the trellis memory at the column specified by the fork_col register, and delete this fork from the fork-memory by setting its fork_active register to 0.

Figure 17:
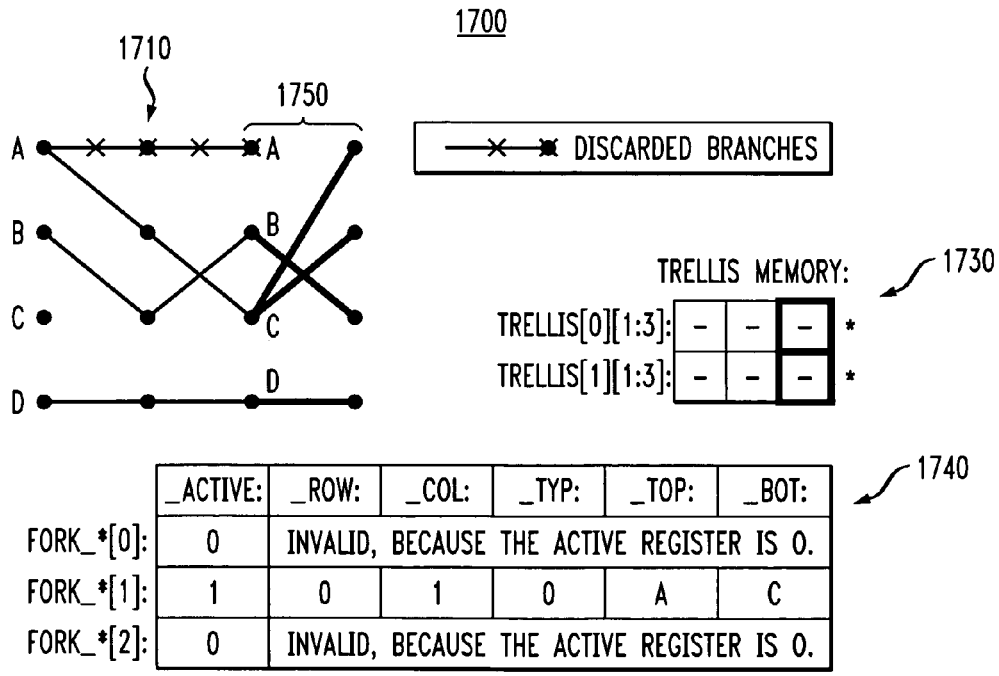
FIG. 17 illustrates an example trellis and data objects after a new trellis stage has been appended during step 2 and before the trellis reconnection of FIG. 14.

FIG. 17 illustrates an example trellis 1710 and data objects 1730, 1740 after a new trellis stage has been appended during step 2 and before the trellis reconnection. The new stage 1750 is shown in FIG. 17.

Figure 18:
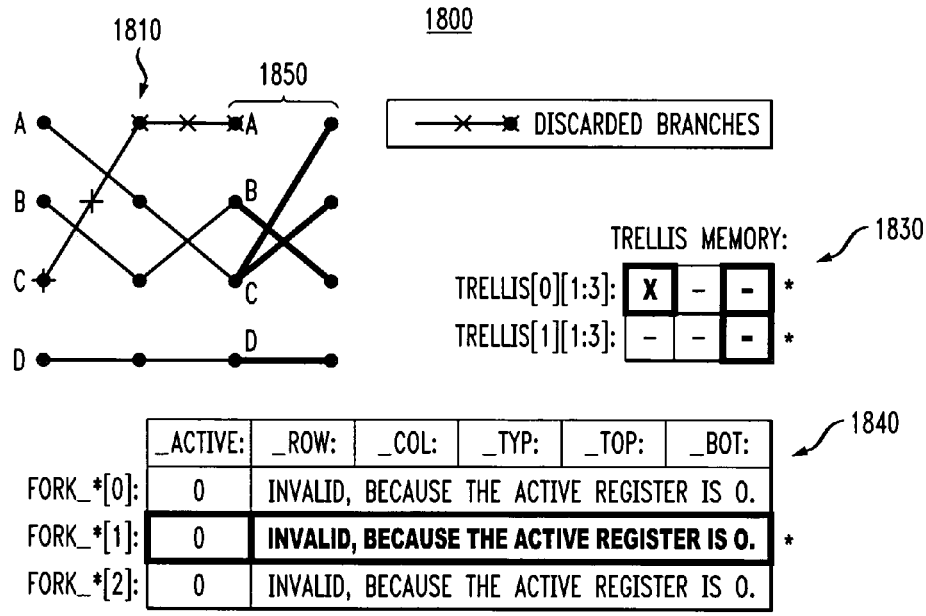
FIG. 18 illustrates the resulting trellis and data objects after trellis reconnecting (step 2*a*) and before step 2*b* of FIG. 14.

The fork contained in the new stage at state C discards the previously rightmost state A and its associated survivor path. Searching the fork_top and fork_bot registers for A reveals that fork_top[1]=A, i.e., the top-branch of fork 1 is connected to the discarded survivor path A. Therefore, the trellis must be reconnected as specified by case 1 of FIG. 10, i.e., the trellis memory trellis[0][1] must be accessed, because fork_row[1]= 0 and fork_col[1]=1. FIG. 18 shows the resulting trellis 1810 and data objects 1830, 1840, after trellis reconnecting (step 2a) and before step 2b. Updated data objects are marked with an asterisk.

Figure 19:
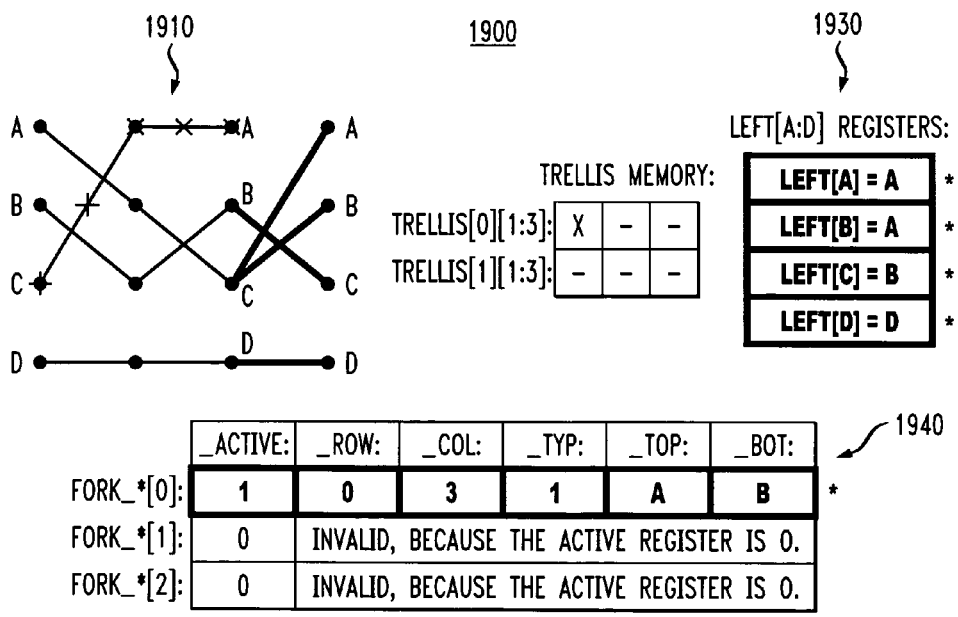
FIG. 19 illustrates the processing of an exemplary new stage containing a new fork by the process of FIG. 14.

Step 2b (updating left registers and fork-registers): Updating the left-registers is simply done by tracing the new appended stage from left to right, i.e., left[x]=u becomes left[y]=u if the new stage contains a branch from the left state x to the right state y. Similarly, the fork_top and fork_bot registers are updated for each active fork. Additionally, if the new stage contains a new fork, then its information is added to the fork memory, as shown in the example of FIG. 19. FIG. 19 continues the example of FIG. 18, after step 2b.

As shown in the table 2000 of FIG. 20, among other benefits, the disclosed trace ahead algorithm has a number of advantages compared to both the conventional register exchange scheme and the trace-back (TB) algorithm (N and L in table 2000 denote the number of states and the memory depth, respectively; and "# MUX2" denotes the number of 2-to-1 multiplexers). It is noted that the advantages shown in FIG. 20 come at the expense of a more complex control circuitry for the memory and an additional but small fork memory.

System and Article of Manufacture Details

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

I claim:

1. A method for determining survivor paths in a trellis processed by a Viterbi detector, comprising:

maintaining a trellis memory having a depth L that stores L trellis stages, each of said L stages having a plurality, N, of trellis states;

maintaining a status memory for each of said N states of said trellis, wherein each entry in said status memory identifies a least recent trellis state stored in said trellis memory of a survivor path that begins at a given state on a side of said trellis associated with most recent states;

determining a bit sequence of one or more of said survivor paths in said trellis in an order that said bits are received by examining least and most recent trellis stages of said trellis and said status memory; and deleting least recent stages from said trellis.

2. The method of claim 1, wherein said deleting step further comprises the step of reading out least recent bits of survivor paths.

3. The method of claim 1, wherein said deleting step further comprises the step of updating said status memories.

4. The method of claim 1, further comprising the step of appending a new stage at the most recent end of said trellis.

5. The method of claim 4, wherein said step of appending a new stage at the most recent end of said trellis further comprises the step of updating said status memory and one or more fork registers containing information on one or more forks in said trellis.

6. The method of claim 4, wherein said step of appending a new stage at the most recent end of said trellis further comprises the step of reconnecting discarded fork branches.

7. The method of claim 6, wherein said step of reconnecting discarded fork branches is performed when a previously active fork becomes inactive.

8. The method of claim 1, further comprising the step of maintaining an indication of whether one or more butterfly trellises in said trellis have branches that are parallel or crossed.

9. The method of claim 1, further comprising the step of maintaining an indicator of whether a given fork is active.

10. The method of claim 1, further comprising the step of maintaining a list of active forks.

11. The method of claim 1, further comprising the step of specifying a trellis position of active forks in said trellis.

12. The method of claim 1, further comprising the step of specifying a fork type of one or more forks in said trellis.

13. A system for determining survivor paths in a trellis processed by a Viterbi detector, comprising:
- a trellis memory having a depth L that stores L trellis stages, each of said L stages having a plurality, N, of trellis states;
- a status memory for each of said N states of said trellis, wherein each entry in said status memory identifies a least recent trellis state stored in said trellis memory of a survivor path that begins at a given state on a side of said trellis associated with most recent states; and
- at least one processor, in communication with one or more of said trellis memory and said status memory, operative to:
- determine a bit sequence of one or more of said survivor paths in said trellis in an order that said bits are received by examining least and most recent trellis stage of said trellis and said status memory; and
- delete least recent stages from said trellis.

14. The system of claim 13, wherein said least recent stages are deleted from said trellis by reading out least recent bits of survivor paths.

15. The system of claim 13, wherein said least recent stages are deleted from said trellis by updating said status memories.

16. The system of claim 13, wherein said processor is further configured to append a new stage at the most recent end of said trellis.

17. The system of claim 16, wherein said new stage is appended at the most recent end of said trellis by updating said status memory and one or more fork registers containing information on one or more forks in said trellis.

18. The system of claim 16, wherein said new stage is appended at the most recent end of said trellis by reconnecting discarded fork branches.

19. The system of claim 18, wherein said discarded fork branches are reconnected when a previously active fork becomes inactive.

20. The system of claim 13, wherein said processor is further configured to maintain an indication of whether one or more butterfly trellises in said trellis have branches that are parallel or crossed.

21. The system of claim 13, further comprising one or more fork memories that record one or more of (i) an indicator of whether a given fork is active; (ii) a list of active forks: (iii) a trellis position of active forks in said trellis; and (iv) a fork type of one or more forks in said trellis.

22. An article of manufacture for determining survivor paths in a trellis processed by a Viterbi detector, comprising a recordable medium containing one or more programs which when executed implement the steps of:
- maintaining a trellis memory having a depth L that stores L trellis stages, each of said L stages having a plurality, N, of trellis states;
- maintaining a status memory for each of said N states of said trellis, wherein each entry in said status memory identifies a least recent trellis state stored in said trellis memory of a survivor path that begins at a given state on a side of said trellis associated with most recent states;
- determining a bit sequence of one or more of said survivor paths in said trellis in an order that said bits are received by examining least and most recent trellis stages of said trellis and said status memory; and
- deleting least recent stages from said trellis.

* * * * *